(12) United States Patent
Hare et al.

(10) Patent No.: US 6,331,374 B1
(45) Date of Patent: Dec. 18, 2001

(54) IMAGING TRANSFER SYSTEM AND PROCESS FOR TRANSFERRING IMAGE AND NON-IMAGE AREAS THEREOF TO A RECEPTOR ELEMENT

(75) Inventors: Donald S. Hare, Hawley, PA (US); Scott A. Williams, Rochester, NY (US)

(73) Assignee: Foto-Wear, Inc., Milford, PA (US)

( * ) Notice: Subject to any disclaimer, the term of this patent is extended or adjusted under 35 U.S.C. 154(b) by 0 days.

(21) Appl. No.: 09/539,711

(22) Filed: Mar. 31, 2000

Related U.S. Application Data

(62) Division of application No. 08/970,424, filed on Nov. 14, 1997.
(60) Provisional application No. 60/030,933, filed on Nov. 15, 1996.

(51) Int. Cl.⁷ .............................. G03C 8/26; G03C 11/12
(52) U.S. Cl. ................ 430/211; 430/138; 430/256; 430/259; 430/262; 430/263; 503/208; 503/214; 503/227
(58) Field of Search ..................... 430/138, 200, 430/211, 256, 259, 262, 263, 254; 503/208, 214, 227

(56) References Cited

U.S. PATENT DOCUMENTS

| | | | |
|---|---|---|---|
| 4,555,436 | 11/1985 | Geurtsen et al. | 428/200 |
| 4,751,165 * | 6/1988 | Rourke et al. | 430/138 |
| 5,019,475 * | 5/1991 | Higashiyama et al. | 430/138 |
| 5,139,917 * | 8/1992 | Hare | 430/138 |
| 5,242,739 * | 9/1993 | Kronzer et al. | 428/200 |
| 5,612,168 * | 3/1997 | Ishikawa et al. | 430/263 |
| 5,798,179 | 8/1998 | Kronzer | 428/411.1 |
| 5,948,586 * | 3/1999 | Hare | 430/138 |

FOREIGN PATENT DOCUMENTS

| | | |
|---|---|---|
| 0820874 A1 | 1/1998 | (EP) . |
| 2202641 A | 9/1988 | (GB) . |
| 8704393 | 7/1987 | (WO) . |
| 9321561 | 10/1993 | (WO) . |
| 9733763 | 9/1997 | (WO) . |
| 9821398 | 5/1998 | (WO) . |

* cited by examiner

Primary Examiner—Richard L. Schilling
(74) Attorney, Agent, or Firm—Birch, Stewart, Kolasch & Birch, LLP

(57) ABSTRACT

The present invention relates to an imaging system, which comprises a support having a front and rear surface, at least one layer of microcapsules or at least one layer of microcapsules and developer in the same layer or at least one layer of microcapsules and developer in separate layers, on said front surface of the support, wherein the microcapsules or developer or microcapsules and developer are dispersed in a carrier of the invention, said carrier is capable of transferring and adhering developed image and non-image areas from said front surface of said support upon the application of heat energy to the rear surface of the support, said carrier strips from said front surface of the support by liquefying and releasing from said support when heated, said liquefied carrier providing adherence to a receptor element by flowing onto said receptor element and solidifying thereon, said adherence does not require an external adhesive layer, with the proviso that the carrier is not capable of reacting to form an image, and when the microcapsules are present together in the same layer as the carrier, the carrier has a particle size which is the same as or smaller than that of the microcapsules, and an optional protective layer of clear thermoplastic.

13 Claims, No Drawings

IMAGING TRANSFER SYSTEM AND PROCESS FOR TRANSFERRING IMAGE AND NON-IMAGE AREAS THEREOF TO A RECEPTOR ELEMENT

This application is a divisional of copending application Ser. No. 08/970,424, filed on Nov. 14, 1997, the entire contents of which are hereby incorporated by reference.

The contents of Provisional Application U.S. Serial No. 60/030,933 filed Nov. 15, 1996 on which the present application is based and benefit is claimed under 35 U.S.C. 119(e), is herein incorporated by reference.

BACKGROUND OF THE INVENTION

1. Field of the Invention

The present invention relates to a transfer element, preferably using CYCOLOR or THERMO-AUTOCHROME technology, and to a method of transferring developed image areas and non-image areas to a receptor element.

2. Description of the Prior Art

CYCOLOR technology provides full color imaging generally associated with photography. With CYCOLOR technology, for example, a polyester base may be coated with light-sensitive microcapsules called cyliths, which are sensitive to red, green and blue light. Each cylith resembles a water-filled balloon and is about one-tenth the diameter of a human hair. The cyliths contain a liquid monomer in which is dissolved a light sensitive photoinitiator and a color forming substance called a leuco dye.

The support (e.g., polyester) is exposed to light transmitted through or reflected from an original color image. The resulting latent image resembles the negative used in conventional photography. Exposure to light hardens the cyliths in proportion to the amount of exposure, rendering them resistant to physical rupture. Thus, the latent image is a pattern of hard (exposed) and soft (unexposed) cyliths.

The final image is developed by bringing the cyliths into contact with a sheet of CYCOLOR paper or transparency. Full color is obtained by mixing three different types of cyliths and coating them on a support (e.g., polyester). Each of the three types of cyliths contain either a cyan, magenta or yellow leuco dye, along with photoinitiators that are sensitive respectively to red, green or blue light. Exposure to red light hardens the capsules containing the cyan dye. Pressure development results in the release of magenta and yellow dyes which mix to form a red image. Exposure to green light controls the magenta dye. Pressure development results in the cyan and yellow dyes mixing to form a green image. Blue light controls the yellow dye. Pressure development results in the mixing of the cyan and magenta dyes to form a blue image. Exposure of all cyliths (white light) results in non color (white or non-image area) and exposure of none of the cyliths results in black. Any color can be reproduced by controlling the relative proportion of the three dyes.

Applications of CYCOLOR technology include use in color copiers to make color copies, or this technology may be used to create hard copy prints from 35 mm slides. Other applications include use with color computer printers to provide prints from computer systems. CYCOLOR technology also works with digital imaging techniques by providing hard copies of images, produced by electronic cameras.

Provisional application no. 60/029,917 requires that: the silver halide light-sensitive grains are dispersed within a carrier which functions as a transfer layer, and does not have a separate transfer layer. Provisional application no. 60/056,446 requires that the silver halide transfer element has a separate transfer layer. Provisional application no. 60/030,933 relates to a transfer element using Cycolor technology, but having no separate transfer layer.

U.S. Pat. No. 4,751,165 discloses an imaging system which provides an imaging sheet and a layer of microcapsules containing a photosensitive composition and a color former. However, the developed image and non-image areas thereof are not capable of being simultaneously transferred to a receptor element.

Accordingly, imaging systems based on photosensitive encapsulates are known. U.S. Pat. No. 3,219,446 by Berman discloses the selected transfer of dye to a copy sheet. U.S. Pat. No. 3,700,439 by Phillips discloses a photocopy process involving development of capsules without transfer.

U.S. Pat. No. 4,771,032 discloses a thermo-autochrome system, which is a direct thermal full color hardcopy system involving thermal media capable of producing color images with the use of microcapsules.

U.S. Pat. No. 5,139,917 discloses an imaging system wherein the developed image and non-image areas are transferred to a receptor element by a separate transfer coating layer. Unlike the imaging system of U.S. Pat. No. 5,125,917, the imaging system of the invention does not have a separate transfer coating layer.

Provisional application titled "IMAGING TRANSFER SYSTEM AND PROCESS FOR TRANSFERRING LIGHT-FIXABLE THERMAL IMAGE TO A RECEPTOR ELEMENT" (Inventors—Donald S. Hare and Scott Williams; Attorney Docket No. 175-180P) filed on Nov. 14, 1997, relates to transferring thermo-autochrome materials with a separate transfer layer.

SUMMARY OF THE INVENTION

Accordingly, the present invention is directed to an imaging system which comprises, a support having a front and rear surface, at least one layer of (e.g. photosensitive or thermal-sensitive) microcapsules, or at least one layer of (e.g. photosensitive or thermal-sensitive) microcapsules and developer (e.g. generally for photosensitive microcapsules) in the same layer, or at least one layer of (e.g. photosensitive or thermal-sensitive) microcapsules and developer in separate layers, on said front surface of the support, wherein said microcapsules, or developer or both are dispersed in the carrier of the invention, said carrier preferably having a melting point of at least 100° C., and which is capable of transferring and adhering developed image and non-image areas from said front surface of said support upon the application of heat energy to the rear surface of the support, said carrier strips from said front surface of the support by liquefying and releasing from said support when heated, said liquefied carrier providing adherence to a receptor element by flowing onto said receptor element and solidifying thereon, said adherence does not require an external (e.g. surface) adhesive layer and preferably occurs in an area at least coextensive with the area of said microcapsules, with the proviso that the carrier is not capable of reacting (e.g. with a color precursor) to form an image, and an optional layer of clear thermoplastic material. Preferably, the particle size of the carrier is the same as or smaller than that of the microcapsules, for example, from 1–20 micrometers.

The present invention also relates to a method of applying an image to a receptor element, which comprises the steps of:

(a) exposing imagewise the imaging element described above, (b) developing the imagewise exposed element to form an image, (c) positioning the front surface of said developed element (or positioning the undeveloped element prior to development) against said receptor element, and (d) applying energy (e.g heat) to the rear surface of the element to transfer the developed image and non-image area to said receptor element.

The receptor element may be textile, leather, ceramic, wool, glass or plastic. Preferably, the receptor element is a shirt or the like. Other suitable receptor surfaces include canvas, paper, glass, or receptor supports used by the museum or conservatory industry. Energy applied to the rear surface of the element is heat and/or pressure (e.g via ironing).

DETAILED DESCRIPTION OF THE INVENTION

The term "encapsulated" refers to both so-called resin dispersion or open phase systems in which the internal phase containing a chromogenic material is dispersed as droplets throughout a dispersing medium (e.g. carrier) and systems in which the capsule is formed with a discrete capsular wall, the latter encapsulation typically being in the form of microcapsule. The term "microcapsule" includes both microcapsules having discrete walls and microcapsules within a so-called open phase system comprising a dispersion of the internal phase constituents in a binder. "Pressure rupturable capsules" are, accordingly, considered to exist in either of these "encapsulated" systems. Furthermore, while the capsules are described herein as "pressure rupturable" means other than pressure may be used to rupture them (e.g. heat).

The term "actinic radiation" includes the entire electromagnetic spectrum including ultraviolet (U.V.) and infrared (I.R.) radiation.

The (e.g. photosensitive) microcapsules used in the present invention can be prepared as described in U.S. Pat. Nos. 4,751,165, 4,299,209, 4,440,846, 4,842,980, 4,772,530, 4,772,541, 4,482,624 and 4,771,032.

Typically, CYCOLOR copiers/printers utilize a paper containing a vagt number of colored Microcapsules which, when exposed to varying degrees of energy (e.g. heat, light or pressure) form a color image. In the present invention a carrier for the microcapsules is coated on the base support layer. As a result of the invention, the carrier will release under energy (e.g. heat) and carry the image and non-image areas to the receptor (e.g. textile) in washproof color.

Furthermore; in a further representative use of CYCOLOR technology two sheets of paper are required, A color encapsulated "donor" roll marries a second paper at the point of light/heat. The donor sheet comprises a support and a top coating containing image (e.g. color) forming microcapsules optionally embedded in the carrier of the invention, wherein the "latent" image is transferred to a receptor sheet comprising a support and a developer containing layer comprising developer and the carrier of the inventions As a result of the invention, the developed image and non-image areas may then be transferred to a receptor element (e.g. textile).

Therefore, in a single self-contained imaging sheet comprising a support, at least one layer of image forming microcapsules, plus optional developer in the same or different layer, and carrier of the invention combined with at least the microcapsules or developer or both, and optional layer of clear thermoplastic, the image and non-image areas may be directly transferred to a receptor element (e.g. textile). In a two sheet system, the sheet ultimately containing the developed image should have the carrier of the invention so that the image and non-image areas may be directly transferred to the receptor element.

A representative imaging sheet of the invention is based on the Imaging sheet of U.S. Pat. No. 4,751,165 except that it incorporates the carrier of the present invention. This imaging sheet is set forth in FIG. 1 and is generally repregented by reference numeral 10. The imaging sheet 10 includes a support 12 and a photosensitive layer 14 containing the carrier of the invention on one surface thereof. The layer 14 includes photosensitive microcapsules 16 and a developer resin (e.g., phenqlic) 18 embedded in the instant carrier. The microcapsules 16 and developer resin 18 do not need to be coated in the same layer, but can be coated in contiguous layers with the microcapsules underlying or overlying a layer of the developer resin. However, at least one of these layers must contain the instant carrier. The support 12 may be a polymeric film. If the support 12 is transparent, the imaging sheet can be exposed from either surface. The developer layer 18 is not necessarily a film but may consist of finely divided dispersion particles, optionally including the instant carrier. Similarly, developer layer 18 is not necessarily contiguous but may be interrupted by pores or capillaries.

Techniques for exposing and developing the above-described imaging sheet 10 are known in the art (see FIG. 2 of U.S. Pat. No. 4,751,165).

The mechanism whereby the microcapsules rupture and release the internal phase is explained in more detail in U.S. Pat. Nos. 4,751,165 and 4,399,209. Exposure alone or in conjunction with heating effects a change in the viscosity of the internal phase such that the internal phase is differentially released from the microcapsules in the exposed and unexposed areas upon subsequent application of rupture and transfer force.

After exposure, the imaging sheet 10 is developed alone or is assembled with the receptor element prior to development. The imaging sheet is developed by applying a rupturing force such as with pressure rollers.

The imaging sheet/receptor element assembly is heated to melt the carrier coating so that the image and non-image areas are transferred to the receptor element.

The color former reacts with the developer to produce a visible dye image. The entire image and non-image area is transferred to the receptor element. This is contrary to the teachings of U.S. Pat. No. 4,751,165, wherein the image areas selectively adhere to the paper while the non-image areas remain attached to the support.

Full color imaging systems are described in more detail in U.S. Pat. No. 4,842,976.

Representative developer containing resins include. phenolic developer resins, as described in U.S. Pat. No. 4,751,165.

The developer-containing resin and microcapsule composition can be coated using conventional coating techniques such as blade coating, roll coating, etc.

The photosensitive composition may comprise photohardenable or photosoftenable compositions. Examples of both are provided in U.S. Pat. No. 4,399,209.

In one embodiment of the invention full color images are formed. In this embodiment, the photosensitive layer 14 contains a mixture of microcapsules having distinct wavelength sensitivities and containing cyan, magenta, yellow and optionally black color formers. See U.S. Pat. No. 4,751,165 and 4,842,976. The microcapsules are mixed and coated with a developer-containing resin as described above, plus carrier of the invention. If the microcapsules are respectively sensitive to red, green, and blue light, the imaging sheet can be exposed by direct transmission or reflection imaging. In most cases, however, the microcapsules have distinct sensitivities in the ultraviolet spectrum. In this case, color separation or image processing is required to expose the imaging sheet. Using color separations, the imaging sheet is exposed to three distinct bands of ultraviolet radiation through the color separation in order to control the release and transfer of the cyan, magenta, and yellow color formers. Alternatively, a color image is resolved into its red, green, blue, and optionally black components each of which is then respectively electronically translated into radiation to which the photosensitive composition associated with the complimentary color former is sensitive. The exposure device will control three or four distinct bands of radiation which may be emitted from a single radiation source or a plurality of sources. For example, a Dunn or matrix camera may be used to produce electronic signals corresponding to the cyan, magenta, and yellow (and optionally black) images that are desired. This output drives the electronic control means for an exposure device which may include a conventional multiplexer logic package and timing means. The exposure device selectively drives a radiation source to which the microcapsules on the imaging sheet are sensitive and thereby image-wise exposes the imaging sheet. Various imaging apparatuses are described in U.S. Pat. No. 4,751, 165.

The receptor surface for the image and non-image areas is preferably a textile such as a shirt (e.g., tee shirt) or the like. However, any receptor capable of receiving the imaging material (e.g. image and non-image areas) of the imaging sheet and imparting the desired washproof properties is within the scope of the invention. Other suitable receptor surfaces include canvas, wool, plastic, ceramic, leather, paper, glass or receptor supports used by the museum or conservatory industry.

The imaging sheet comprises a suitable support or substrate which may be any type of known material ordinarily used as a support for imaging materials (e.g. paper, plastic coated papers, PET resins, etc.). The carrier material capable of holding developed image and non-image areas which can then be transferred to a receptor surface is coated on the support or substrate with either m or developer, or both.

One requirement of a suitable carrier of the invention is that it adhere strongly to fibrous supports, and optionally to glassy supports. Moreover, the carrier of the invention must not necessarily be entirely "inert". That is, since the life of a transferred product (e.g. image transferred to a tee shirt) ig measured in months or years rather than decades, adverse affect on image stability is not considered problematic. This expected short life of the ultimate product allows for the selection of less expensive materials. Further, other properties may be similarly reoptimized, if necessary, in view of the expected short life of the product.

The carrier of the invention must also be capable of transfer from the support (e.g. imaging sheet) and adherence to a receptor support without the requirement of a separate surface adhesive layer. Without being bound by any theory, upon back surface heating of the support, the carrier would undergo a solid to solution phase transition resulting in a transfer to the receiving layer. Edge to edge adhesion, to the receiving layer, would occur upon cooling of the carrier onto the receiving layer. Upon cooling, an image layer would be completely transferred onto the receiving element. The carrier of the invention provides mechanical and thermal stability, as well as washability.

The carrier should provide a colorfast image (e.g. washproof or wash resistant) when transferred to the receptor surface. That is, upon washing the receptor element (e.g. tee shirt), the image should remain intact on the receptor element.

Suitable carriers of the invention are exemplified below. However, it is easy to screen for suitable carriers without undue experimentation in view of the performance criteria discussed in this application. For instance, see the Examples discussed below for suitable screening protocol. Further, the carriers of the invention may be mixed with conventional carriers so long as the amount of conventional carrier does not adversely affect the transfer properties of the carrier.

The clear thermoplastic protective material of the invention includes, for instance, vinyl resins such as ethylene/vinyl acetate copolymers, resin enters, vinyl alcohol/vinyl acetate copolymers, vinyl alkyl ether/maleic anhydride copolymers, polyvinyl chloride, vinyl chloride/vinyl acetate copolymers and the like, acrylic resins such as polyethyl acrylate, polybutyl methacrylate, polymethyl cyanoacrylate and the like, styrene resins, polyamide resins and waxes. The selected thermoplastic material should liquify under heat/pressure during transfer and resolidify when cool. This material protects against abrasion and inadvertent exposure to water.

Suitable carrier materials include the compositions from U.S. Pat. Nos. 5,501,902, 5,271,990 and 5,242,739. The contents of U.S. Pat. Nos. 5,501,902, 5,271,990 and 5,242,739 are herein incorporated by reference. These patents are discussed in turn hereinbelow.

The carrier of the present invention utilizes the materials of the second layer of U.S. Pat. No. 5,501,902.

The carrier preferably includes particles of a thermoplastic polymer having dimensions of from about 1 to about 50 micrometers, preferably about 1 to about 20 micrometers. The particles will more preferably have dimensions of from about 2 to about 10 micrometers. In general, the thermoplastic polymer can be any thermoplastic polymer which meets the criteria set forth herein. Desirably, the powdered thermoplastic polymer will be selected from the group consisting of polyolefins, polyesters, and ethylene-vinyl acetate copolymers.

The carrier also includes from about 10 to about 50 weight percent of a film-forming binder, based on the weight of the thermoplastic polymer. Desirably, the amount of binder will be from about 10 to about 30 weight percent. In general, any film-forming binder may be employed which meets the criteria set forth herein. When the second layer includes a cationic polymer, a nonionic or cationic dispersion or solution may be employed as the binder. Suitable binders include polyacrylates, polyethylenes, and ethylenevinyl acetate copolymers. The latter are particularly desired because of their stability in the presence of cationic polymers. The binder desirably will be heat softenable at temperatures of about 12° Celsius or lower.

The basis weight of the carrier layer may vary as desired, but preferably the carrier is cumulatively present amongst all the layers in an amount from about 5 to about 30 g/m$^2$. Desirably, the basis weight will be from about 10 to about 20 g/m$^2$. The carrier layer(s) can be applied to the support, either directly or over another layer, by means well known to those having ordinary skill in the art. For example, the layer may be applied by curtain coating, Meyer rod, air knife, and gravure coating, by way of illustration only.

When the imaging element is intended to be used as a heat-transfer material, the carrier will have a melting point of from about 65 to about 180 degrees Celsius. The term "melts" and variations thereof are used herein only in a qualitative sense and are not meant to refer to any particular test procedure. Reference herein to a melting temperature or range is meant only to indicate an approximate temperature or range at which a polymer or binder melts and flows under the conditions of a melt-transfer process to result in a substantially smooth film.

Manufacturers' published data regarding the melt behavior of polymers or binders correlate with the melting requirements described herein. It should be noted, however, that either a true melting point or a softening point may be given, depending on the nature of the material. For example, materials such a polyolefins and waxes, being composed mainly of linear polymeric molecules, generally melt over a relatively narrow temperature range since they are somewhat crystalline below the melting point.

Melting points, if not provided by the manufacturer, are readily determined by known methods such as differential scanning calorimetry. Many polymers, and especially copolymers, are amorphous because of branching in the polymer chains or the side-chain constituents. These materials begin to soften and flow more gradually as the temperature is increased. It is believed that the ring and ball softening point of such materials, as determined by ASTM E-28, is useful in predicting their behavior. Moreover, the melting points or softening points described are better indicators of performance than the chemical nature of the polymer or binder.

When the material is intended to be used as a heat-transfer material, the carrier desirably also will contain from about 2 to about 20 weight percent of a cationic polymer, based on the weight of the thermoplastic polymer. The cationic polymer may be, for example, an amide-epiclalorolyarin polymer, polyacrylamides with cationic functional groups, polyethyleneimines, polydiallylamines, and the like. When a cationic polymer is present, a compatible binder should be selected. The binder desirably will be a nonionic binder, either in the form of a solution or a nonionic or cationic dispersion or emulsion. As is well known in the paper coating art, many commercially available binders have anionically charged particles or is polymer molecules. These materials are generally not compatible with the cationic polymer which may be used in the present invention.

One or more other components may be used in the carrier. For example, the carrier may contain from about 1 to about 20 weight percent of a humectant, based on the weight of the thermoplastic polymer. Desirably, the humectant will be selected from the group consisting of ethylene glycol and poly(ethylene glycol). The poly(ethylene glycol) typically will have a weight average molecular weight of from about 100 to about 40,000. A poly(ethylene glycol) having a weight-average molecular weight of from about 200 to about 800 is particularly useful.

The carrier also may contain from about 0.2 to about 10 weight percent of a fluid (e.g. ink) viscosity modifier, based on the weight of the thermoplastic polymer. The viscosity modifier desirably will be a poly(ethylene glycol) having a weight-average molecular weight of from about 100,000 to about 2,000,000. The poly(ethylene glycol) desirably will have a weight-average molecular weight of from about 100,000 to about 600,000.

Other components which may be present in the carrier layer include from about 0.1 to about 5 weight percent of a weak acid and from about 0.5 to about 5 weight percent of a surfactant, both based on the weight of the thermoplastic polymer. A particularly useful weak acid is citric acid. The term "weak acid" is used herein to mean an acid having a dissociation constant less than one (or a negative log of the dissociation constant greater than 1).

The surfactant may be an anionic, a nonionic, or a cationic surfactant. When a cationic polymer ig present in the carrier, the surfactant should not be an anionic surfactant.

Desirably, the surfactant will be a nonionic or cationic surfactant. However, in the absence of the cationic polymer, an anionic surfactant may be used, if desired. Examples of anionic surfactants include, among others, linear and branched-chain sodium alkylbenzenesulfonates, linear and branched-chain alkyl sulfates, and linear and branched-chain alkyl ethoxy sulfates. Cationic surfactant include, by way of illustration, tallow trimethylammonium chloride. Examples of nonionic surfactants, include, again by way of illustration only, alkyl polyethoxylates, polyethoxylated alkylphenols, fatty acid ethanol amides, complex polymers of ethylene oxide, propylene oxide, and alcohols, and polysiloxane polyethers. More desirably, the surfactant will be a nonionic surfactant.

For heat transfer applications, the material of the invention may optionally have a melt-transfer layer located above the support and below the layers containing microcapsules, developer or both. Such a melt-transfer film layer typically comprises a film forming binder, as already described, or other polymer. The layer desirably is applied by extrusion coating, but other methods also may be used. The melt-transfer film layer desirably is formed from a polyethylene or a copolymer of ethylene with acrylic acid, methacrylic acid, vinyl acetate, or acrylic acid esters such as ethyl acrylate. The polymer desirably will have a melt flow rate of at least about 30 grams per 10 minutes (g/10 minutes), as determined in accordance with ASTM Method D-1238, although the melt flow rate may be as high as about 4,000 g/10 minutes. More desirably, the melt flow rate of the polymer will be from about 300 to about 700 g/10 minutes. The basis weight of the melt-transfer film layer desirably will be from about 10 to about 50 grams per square meter ($g/m^2$), with a basis weight of from about 30 to about 50 being more desired.

A release layer may be included, either in place of or in addition to the melt-transfer film layer. In the former instance, the release layer will be placed above the support and below the microcapsule containing layer(s). In the latter instance, the release layer will be placed between the support and the melt-transfer film layer. The release layer desirably will be a low molecular weight ethylene-acrylic acid copolymer applied from an aqueous dispersion. The melt flow rate of the ethylene-acrylic acid copolymer desirably will be at least about 200 g/10 minutes, more desirably from about 800 to about 1,200 g/10 minutes. Such dispersion also may contain a paraffin wax, which is mixed as an emulsion with the ethylene-acrylic acid copolymer dispersion. The paraffin wax emulsion can be any of those which are commercially available, such as Chemwax ® 40 (Chematron, Inc., Charlotte, N.C.). The ratio of paraffin wax to the copolymer may vary from 0 to about 4, with a ratio of about 1 being more desirable. The basis weight of the release layer desirably will be from about 2 to about 20 $g/m^2$, more desirably from about 6 to about 10 $g/m^2$. The release coating as described melts easily and provides easy release from the first layer for hand ironing images onto a fabric; such characteristic is especially useful if heating of the image is irregular, which is not atypical of hand-ironing techniques.

The various layers of the imaging material are formed by known coating techniques, such as by roll, blade, curtain coating and air-knife coating procedures. The resulting material, then is dried by means of, for example, steam-heated drums, air impingement, radiant heating, or some combination thereof. Some care must be exercised, however, to assure that drying temperatures are sufficiently low so that the particles of thermoplastic polymer present in the carrier layer do not melt during the drying process (e.g. air impingement for 5 minutes or more at 80° Celsius).

Heat transfer of an image in the imaging material of the present invention may be by any known means, such as by a hand-held iron or a heat transfer press. The transfer temperature typically will be from about 120° to about 205° Celsius, for from about 5 seconds to about 2 minutes.

Accordingly; the carrier of the invention may comprise particles of a thermoplastic polymer preferably having dimensions of from about 1 to about 50 micrometers, preferably about 1 to about 20 micrometers, and more preferably from about 2 to about 10 micrometers, from about 10 to about 50 weight percent of a film-forming binder, based on the weight of the thermoplastic polymer, and from about 0.2 to about 10 weight percent of a viscosity modifier, based on the weight of the thermoplastic polymer.

The carrier preferably has a melting point of more than 100° C. and more preferably from about 100 to about 180 degrees Celsius. The carrier may also contain from about 2 to about 20 weight percent of a cationic polymer, based on the weight of the thermoplastic polymer. The carrier may also contain from about 1 to about 20 weight percent of a humectant, based on the weight of the thermoplastic polymer. The humectant may be (1) ethylene glycol or (2) polyethylene glycol (e.g. having a weight-average molecular weight of from about 100 to about 40,000, preferably about 200 to about 800).

The viscosity modifier may be a polyethylene glycol having a weight average molecular weight of from 100,000 to about 2,000,000, preferably from about 100,000 to about 600,006. The viscosity modifier may be low or high viscosity methyl cellulose or polyvinyl alcohol.

The carrier may also include about 0.1 to about 5 weight percent of a weak acid, based on the weight of the thermoplastic polymer. The carrier may also include about 0.5 to about 5 weight percent of a surfactant (e.g. nonionic or cationic), based on the weight of the theroplastic polymer.

A release layer is optionally interposed between the support and the layers containing carrier of the invention.

The carrier preferably melts above 100° C., more preferably, from about 100 to about 180 degrees Celsius and may comprise particles of a thermoplastic polymer having dimensions of about 1 to about 20 micrometers, more preferably from about 2 to about 10 micrometers, from about 10 to about 50 weight percent of a film-forming binder, based on the thermoplastic polymer, and from about 2 to about 20 weight percent of a cationic polymer, based on the weight of the thermoplastic polymer.

The carrier may further comprise from about 1 to about 20 weight percent of a humectant, based on the weight of the thermoplastic polymer (and optionally from about 0.2 to about 10 weight percent of a fluid (e.g. ink) viscosity modifier, based on the weight of the thermoplastic polymer), and from 0.5 to about 5 weight percent of a surfactant, based on the weight of the thermoplastic polymer.

The carrier of the present invention also utilizes the materials of the image receptive melt-transfer film layer of U.S. Pat. No. 5,271,990.

The carrier may be comprised of a thermoplastic polymer which preferably melts at above 100° C., and preferably in the range of from about 100 to about 180 degrees Celsius (°C). In another embodiment, the thermoplastic polymer melts in the range of from about 100° C. to about 120° C.

The nature of the thermoplastic polymer (e.g. carrier) is not known to be critical, but generally it should be inert (e.g. not adversely affecting the properties relating to the image). That is, any known thermoplastic polymer can be employed so long as it meets the criteria specified herein (e.g. image life of months or years rather than decades). Preferably, the thermoplastic polymer is selected from the group consisting of polyolefins, polyesters, and ethylene-vinyl acetate copolymers, preferably having a particle size of less than 50, preferably less than 20 and more preferably less than 10 micrometers.

If desired, as already noted, the imaging material containing the carrier of the invention may optionally have a melt-transfer film layer. In this instance, the melt-transfer film layer overlays the top surface of the base sheet and the microcapsule layers overlays the melt transfer film layer.

In general, the melt-transfer film layer is comprised of a first thermoplastic polymer and the microcapsule containing layers are comprised of a second thermoplastic polymer, each of which melts preferably above 100° C., and preferably in the range of from about 100° C. to about 180° C. Preferably, the first thermoplastic polymer is selected from the group consisting of polyolefins, polyesters, ethylene-vinyl acetate copolymers, ethylene-methacrylic acid copolymers, and ethylene-acrylic acid copolymers. In addition, the second thermoplastic polymer preferably is selected from the group consisting of polyolefins, polyesters, and ethylene-vinyl acetate copolymers.

The term "melts" and variations thereof are used herein only in a qualitative sense and are not meant to refer to any particular test procedure. Reference herein to a melting temperature or range is meant only to indicate an approximate temperature or range at which a thermoplastic polymer melts and flows under film forming conditions to result in a substantially smooth film.

The carrier may comprise a thermoplastic polymer selected from the group consisting of polyolefins, polyesters, and ethylene-vinyl acetate copolymers and which melts preferably above 100° C., and preferably in the range of from about 100 to about 180 degrees Celsius, and preferably in the range of about 100 to about 120 degrees Celsius.

An example of the carrier of the invention is Elvax 3200 supplied by E. I. Du Pont de Nemours & Company, Inc., Folymer Products Department, Ethylene Polymers Division, Wilmington, Del. Elvax 3200 is an ethylene-vinyl acetate copolymer containing approximately 25% vinyl acetate and modified with wax. It has a melt index of 32 g/10 minutes. Another carrier of the invention is Surlyn 1702 also supplied by DuPont. Surlyn 1702 is an ionomer consisting of a cross-linked ethylene-methacrylic acid copolymer having a melt index of 14 g/10 minutes. These carriers may be utilized separately or together.

The carrier of the present invention also utilizes the materials of the image-receptive melt-transfer film layer of U.S. Pat. No. 5,242,739.

The carrier may comprise from about 15 to about 80 percent by weight of a film-forming binder selected from the group consisting of ethylene-acrylic acid copolymers, polyolefins, and waxes and from about 85 to about 20 percent by weight of a powdered thermoplastic polymer selected from the group consisting of polyolefins, polyesters, polyamides, waxes, epoxy polymers, ethylene-acrylic acid copolymers, and ethylene-vinyl acetate copolymers, wherein each of said film-forming binder and said powdered thermoplastic polymer melts about 100° C., preferably in the range of from about 100 to about 180 degrees Celsius and said powdered thermoplastic is of particles which are from about 1 to about 50 micrometers preferably about 1 to about 20 micrometers in diameter.

Thus, the carrier comprises from about 15 to about 80 percent by weight of a film-forming binder and from about 85 to about 20 percent by weight of a powdered thermoplastic polymer. Each of the film-forming binder and powdered thermoplastic polymer melts above 100° C., preferably in the range of from about 100 to about 180 degrees Celsius (°C.). In addition, the powdered thermoplastic polymer is preferably composed of particles having diameters of from about 1 to about 20 micrometers.

In other embodiments, each of the film-forming binder and powdered thermoplastic polymer preferably melt above 100° C., preferably in the range of from about 100° C. to about 120° C.

The function of the powdered thermoplastic polymer is to assist in the transferring of an image to a fabric, both in terms of ease of transfer and the permanence of the transferred image.

The nature of the film-forming binder is not known to be critical. That is, any film-forming binder can be employed so long as it meets the criteria specified herein. In preferred embodiments, the film-forming binder has, at the transfer temperature, a lower melt viscosity than the powdered thermoplastic polymer. As a practical matter, water-dispersible ethylene-acrylic acid copolymers have been found to be especially effective film forming binders.

In general, the powdered thermoplastic polymer can be any thermoplastic polymer which meets the criteria set forth herein. Preferably, the powdered thermoplastic polymer is selected from the group consisting of polyolefins, polyesters, and ethylene-vinyl acetate copolymers.

The powdered thermoplastic polymer flow partially into the fiber matrix of the fabric to which an image is being transferred. The result is a fabric having an image which does not render the fabric stiff. Moreover, the image itself is neither rubbery nor rough to the feel and is stable to repeated washings.

If desired, as already noted, the imaging material containing the carrier of the invention may optionally have a melt-transfer film layer. In this instance, the melt-transfer film layer overlays the top surface of the base sheet and the imaging layers overlay the melt-transfer film layer.

The melt-transfer film layer comprises a film-forming binder as already described. The image-receptive film layer preferably comprises from about 15 to about 80 percent by weight of a film-forming binder (e.g. ethylene-acrylic acid copolymers; polyolefins and waxes which melt in the range of about 65 to about 180 degrees Celsius). The melt transfer layer may also contain from about 85 to about 20 percent by weight of a powdered thermoplastic polymer, each of which are as already defined.

As a general rule, the amount of powdered thermoplastic polymer employed can be reduced if larger particle sizes are employed. However, it is believed that the smaller the thermoplastic bead, the better. Particle sizes are 1–50 micrometers, preferably from 1–20 micrometers and more preferably 2–10 micrometers.

If desired, any of the foregoing film layers can contain other materials, such as processing aids, release agents, deglassing agents, antifoam agents, and the like. The use of these and other like materials is well known to those having ordinary skill in the art.

Representative binders and powdered thermoplastic polymers are as follows:

Binder A

Binder A is Michem® 58035, supplied by Michelman, Inc., Cincinnati, Ohio. This is a 35 percent solids dispersion of Allied Chemical's AC 580, which is approximately 10 percent acrylic acid and 90 percent ethylene. The polymer reportedly has a softening point of 102° C. and a Brookfield viscosity of 0.65 pa s (650 centipoise) at 140° C.

Binder B

This binder is Michem® Prime 4983 (Michelman, Inc., Cincinnati, Ohio). The binder is a 25 percent solids dispersion of Primacor® 5983 made by Dow Chemical company. The polymer contains 20 percent acrylic acid and 80 percent ethylene. The copolymer has a Vicat softening point of 43° C. and a ring and ball softening point of 100° C. The melt index of the copolymer is 500 g/10 minutes (determined in accordance with ASTM D-1238).

Binder C

Binder C is Michem® 4990 (Michelman, Inc., Cincinnati, Ohio). The material is 35 percent solids dispersion of Primacor® 5990 made by Dow Chemical Company. Primacor® 5990 is a copolymer of 20 percent acrylic acid and 80 percent ethylene. It in similar to Primacor® 5983 (see Binder B), except that the ring and ball softening point is 93° C. The copolymer has a melt index of 1,300 g/10 minutes and Vicat softening point of 39° C.

Binder D

This binder is Michem® 37140, a 40 percent solids dispersion of a Hoechst-Celanese high density polyethylene. The polymer is reported to have a melting point of 100° C.

Binder E

This binder is Michem® 32535 which is an emulsion of Allied Chemical Company's AC-325, a high density polyethylene. The melting point of the polymer is about 138° C. Michem® 32535 is supplied by Michelman, Inc., Cincinnati, Ohio.

Binder F

Binder F is Michem® 48040, an emulsion of an Eastman Chemical Company microcrystalline wax having a melting point of 88° C. The supplier is Michelman, Inc., Cincinnati, Ohio.

Powdered Thermoplastic Polymer A

This powdered polymer is Microthene® FE 532, an ethylenevinyl acetate copolymer supplied by Quantum Industries, Cincinnati, Ohio. The particle size is reported to be 20 micrometers. The vicat softening point is 75° C. and the melt index is 9 g/10 minutes.

Powdered Thermoplastic Polymer B

Powdered Thermoplastic Polymer B is Aqua Polysilk 19. It is a micronized polyethylene wax containing some polytetrafluoroethylene. The average particle size is 18 micrometers and the melting point of the polymer is 102°–118° C. The material is supplied by Micro Powders, Inc., Scarsdale, N.Y.

Powdered Thermoplastic Polymer C

This material is Microthene® FN-500, a polyethylene powder supplied by USI Chemicals Co., Cincinnati, Ohio. The material has a particle size of 20 micrometers, a Vicat softening point of 83° C., and a melt index of 22 g/10 minutes.

Powdered Thermoplastic Polymer D

This polymer is Aquawax 114, supplied by Micro Powders, Inc., Scarsdale, N.Y. The polymer has a reported melting point of 91°–93° C. and an average particle size of 3.5 micrometers; the maximum particle size is stated to be 13 micrometers.

Powdered Thermoplastic Polymer E

Powdered Thermoplastic Polymer E is Corvel® 23-9030, a clear polyester from the Powder Coatings Group of the Morton Chemical Division, Morton Thiokol, Inc., Reading, Pa.

Powdered Thermoplastic Polymer F

This material is Corvel® natural nylon 20-9001, also supplied by Morton Thiokol, Inc.

Powdered Thermoplastic Polymer G

This polymer powder is Corvel® clear epoxy 13-9020, supplied by Morton Thiokol, Inc.

Powdered Thermoplastic Polymer H

Powdered Thermoplastic Polymer H is AClyn® 246A, which has a melting temperature of about 95° C. as determined by differential scanning calorimetry. The polymer is an ethylene-acrylic acid magnesium ionomer. The material is supplied by Allied-Signal, Inc., Morristown, N.J.

Powdered Thermoplastic Polymer I

This polymer is AC-316A, an oxidized high density polyethylene. The material is supplied by Allied Chemical Company, Morristown, N.J.

Powdered Thermoplastic Polymer J

This polymer is Texture 5380, supplied by Shamrock Technologies, Inc., Newark, N.J. It is powdered polypropylene having a melting point of 165° C. and an average particle size of 40 micrometers.

The binders and thermoplastic polymers may be combined and blended as desired. For example, Binder A (e.g. 80 parts) may be blended with powdered thermoplastic polymer A (e.g. 80 parts) and optionally with a fluorocarbon dispersion such as Zonyl 7040 (e.g. 0.20 parts) obtained from Du Pont Another example includes combining Binder B (e.g. 400 parts) and Polymer B (e.g. 70 parts) and blending in a standard laboratory colloid mill. Also, Binder A (e.g. 286 parts) may be combined with Polymer C (e.g. 65 parts). Binder B (e.g. 400 parts) may be combined with Polymer D (e.g. 70 parts). Binder C (e.g. 200 parts) may be combined with Polymer E (e.g. 35 parts) and optionally with propylene glycol (e.g. 20 parts) and water (e.g. 20 parts). Similarly, Binder C (e.g. 200 parts) may be combined with Polymer F (e.g. 54 parts) and optionally with propylene glycol (e.g. 20 parts) and water (e.g. 20 parts). Also, Binder A (e.g. 200 parts) may be combined with Polymer G (e.g. 30 parts) and optionally with propylene glycol (e.g. 20 parts) and water (e.g. 20 parts). Binder D (e.g. 200 parts) may be combined with Polymer H (e.g. 30 parts) and optionally water (e.g. 40 parts) and blended. Binder A (e.g. 286 parts) may be combined with Polymer J (e.g. 40 parts) and optionally with propylene glycol (e.g. 50 parts).

The carrier material is present in sufficient quantity so as to provide a colorfast image when transferred to the receptor surface and to provide for the desired transfer. More specifically, the carrier of the invention may be preferably present in an amount of at least 50% by coating weight based on the total weight of the layers present in the imaging element (excluding support). For instance, at least 10% by weight of the thermoplastic based on the total weight of the layer and at least 40% by weight of the binder based on the total weight of the layer may be present in the layer. This leaves 50% by weight based on the total weight of the layer available for other components such as microcapsules, developer or both. If necessary, multilayer systems can be used. In such an imaging element, the layer or layers closest to the support may contain the carrier of the invention, whereas the uppermost layer or layers may contain conventional carrier(s), or a mixture of the carrier of the invention and conventional carrier. In this way, the bottom-most layer(s) basically serve as the transfer layer(s), without the need of an additional transfer layer(s).

Therefore, if one layer is present, 50% by coating weight based on the total weight of the layer may be carrier. If two layers are present, the carrier may be present in an amount of 50% by weight based on the total weight of the two layers. If three layers are present, the carrier may be present in an amount of 50% by weight based on the total weight of the three layers, and so on.

Referring to FIG. 1, there is generally illustrated a cross-sectional view of the element 10 of the present invention. The element 10 comprises a suitable support or substrate 20 which may be any type of material ordinarily used as a support for imaging materials. Examples thereof include cellulose acetate films, cellulose acetate propionate films, cellulose nitrate films, cellulose acetate butyrate films, polyethylene terephthalate films, polystyrene films, polycarbonate films, and laminated sheets of these films and papers. Suitable papers include papers coated with a polymer of an alpha olefin and preferably an alpha olefin having 2 to 10 carbon atoms, such as polyethylene, polypropylene, etc., and baryta coated papers, etc. The only limitation on the support is that it must separate from the carrier material 30 upon application of heat. If conventional polyolefin paper interferes with transfer due to poor separation from the carrier material, fiber based paper which does not contain a resin coated layer nearest the support layer or on both surfaces is preferably used.

The microcapsule layer(s) containing the carrier of the invention may be optionally coated on known transfer papers such as a transfer paper manufactured by Kimberly-Clark Corporation under the trademark "TRANSEEZE".

An imaging support or substrate may be coated with the desired microcapsules in a conventional manner by methods known to one of ordinary skill in the art. The carrier of the present invention may simply be substituted for conventional carrier(s), or mixed with conventional carrier(s), or may replace the conventional carrier in the bottom-most layer(s) in contact with the support. In the latter embodiment, the number of bottom-most layers which should be replaced is easily determined by first replacing the bottom-most layer and then optionally subsequent layers in order to ensure adequate transfer and adhesion.

One preferred application of this invention is directed to transfer elements capable of producing multicolor dye images. Such a transfer element comprises a support and a plurality of color forming layers coated thereon. The color forming layers include at least one blue recording yellow dye image forming layer, at least one green recording magenta dye image forming layer, and at least one red recording cyan dye image forming layer. Interlayers may be positioned between the color forming layers. Each image-forming layer includes at least one microCapsule layer. The interlayers may contain 100% carrier of the invention, or may contain conventional materials, or a combination thereof.

Accordingly, the present invention is directed to an imaging system (e.g. donor sheet or a self-contained single sheet system), which comprises a support having a front and rear surface, a layer of either microcapsules (e.g. photosensitive; heat-sensitive; color forming), or developer or both, at least one of the layer(s) of microcapsules or developer contains the carrier of the invention, and an optional layer of clear thermoplastic material.

The carrier of the present invention is applicable to any imaging system baged on photosensitive or heat-sensitive encapsulates. Thus, in an imaging system comprising (i) an imaging sheet and developer (e.g. generally for photosensitive microcapsules) material carried on said imaging sheet, or (ii) an imaging sheet and a developer (e.g. generally for photosensitive microcapsules) carried on a separate developer sheet, the imaging sheet having a layer of an encapsulated radiation curable photosensitive or heat sensitive composition, said imaging system capable of forming images by image-wise exposing said imaging sheet to radiation actinic with respect to said photosensitive or with heat for the heat sensitive composition, and rupturing or otherwise dissolving capsules in the presence of said developer material to form an image, wherein the improvement comprises at least one layer of (e.g. photosensitive or heat sensitive) microcapsules, or at least one layer of (e.g. photosensitive or heat sensitive) microcapsules and developer (e.g. generally for photosensitive microcapsules) in the same layer, or at least one layer of m and developer in separate layers, on said front surface of the support, wherein said microcapsules, or developer or both are dispersed in a carrier, said carrier preferably having a melting point of at least 100° C., and which is capable of transferring and adhering developed image and non-image areas from said front surface of said support upon the application of heat energy to the rear surface of the support, said carrier strips from said front surface of the support by liquefying and releasing from said support when heated, said liquefied carrier providing adherence to a receptor element by flowing onto said receptor element and solidifying thereon, said adherence does not require an external (e.g. surface) adhesive layer and preferably occurs in an area at least coextensive with the area of said microcapsules, with the proviso that the carrier is not capable of reacting (e.g. with a color precursor) to form an image, and an optional layer of clear thermoplastic material. Preferably, the particle size of the carrier is the same or smaller than that of the microcapsules, for example, from 1–20 micrometers.

The present invention further relates to a developer sheet which comprises a support having a front and rear surface, and an optional developer material capable of reacting with a color forming substance to form an image dispersed in the carrier of the invention.

Another embodiment of the present invention is directed to an imaging sheet useful in forming images onto a receptor surface, said sheet comprising: a support having a front and rear surface, a plurality of photosensitive or heat sensitive microcapsules and an optional developer on the surface thereof, said microcapsules and said developer being present on the same layer or in contiguous layers on the surface of said support, wherein when both said microcapsules and developer are present in the same layer, said same layer comprises the carrier of the invention, and when the developer and microcapsules are present in different layers, at least one of the different layers comprises the carrier of the invention, said microcapsules containing a color former which is capable of reacting with said developer and forming a visible dye image, said imaging sheet being useful for transferring image and non-image areas onto a receptor surface. In this embodiment, the developer may be a thermoplastic developer-containing resin. Moreover, the microcapsules may contain an internal phase which includes a photosensitive composition which changes in viscosity in response to exposure to actinic radiation.

The present invention further relates of a method of transferring image and non-image areas to a receptor element, which comprises the steps of:

(a) exposing image-wise any of the imaging sheets of the invention having a front surface and a rear surface, (b) developing the image-wise exposed element to form an image, (c) positioning the front surface of the developed element or positioning the undeveloped element prior to development against a receptor element, said developed element or undeveloped element containing the carrier of the invention, and (d) applying heat to the rear surface of the developed or undeveloped element to transfer the developed image and non-image area to the receptor element.

The present invention is further directed to the photosensitive imaging system and self-contained imaging sheet of U.S. Pat. No. 4,440 846 which further comprises the carrier of the present invention.

More specifically, the present invention is directed to a photosensitive imaging system in which images are formed by image-wise reaction of one or more chromogenic materials and a developer, said system comprising:

a substrate having front and back surfaces, a chromogenic material, a radiation curable composition which undergoes an increase in viscosity upon exposure to actinic radiation, a coating containing said chromogenic material and said radiation curable composition on one of said front and back surfaces, and a developer material capable of reacting with said chromogenic material to form a visible image, wherein either the layer containing said coating or developer material, or both contains the carrier of the invention, said radiation curable composition being encapsulated in rupturable capsules as an internal phase, wherein images are formed by image-wise exposing said coating to actinic radiation and rupturing said capsules in the image areas such that said internal phase is released from said capsules in the image areas and said chromogenic material and said developer react pattern-wise to form an image. The internal phase may be encapsulated in a microcapsule having a discrete capsule wall. The chromogenic material may be encapsulated with said radiation curable composition.

The invention further relates to a self-contained imaging sheet in which images are formed by image-wise reaction of one or more chromogenic materials and a
- a substrate having a front and back surface,
- a chromogenic material,
- a radiation curable composition which undergoes an increase in viscosity upon exposure to actinic radiation,
- a coating containing said chromogenic material and said radiation curable composition in the carrier of the invention on one of said front and back surfaces,
- a developer material capable of reacting with said chromogenic material to form a visible image codeposited on said substrate with said coating containing said chromogenic material,
- said radiation curable composition being encapsulated in rupturable capsules as an internal phase,
- wherein images are formed by image-wise exposing said coated substrate to actinic radiation, and rupturing said capsules in the image areas such that said internal phase is released from said capsules in the image areas and said chromogenic material pattern-wise reacts with said developer material to form an image. The internal phase may be encapsulated in a microcapsule having a discrete capsule wall. The chromogenic material may be encapsulated with said radiation curable composition.

The present invention is also directed to the transfer imaging system of U.S. Pat. No. 4,399,209, which further comprises the carrier of the present invention. More specifically, the present invention is directed to a transfer imaging system in which images are formed by image-wise reaction of one or more chromogenic materials and a developer, said system comprising:
- is an imaging sheet comprising a first substrate,
- a radiation curable composition which undergoes an increase in viscosity upon exposure to actinic radiation,
- a coating on one surface of said first substrate comprising said chromogenic material and said radiation curable composition optionally in the carrier of the invention,
- said radiation curable composition being encapsulated in rupturable capsules as an internal phase, and
- a developer sheet comprising a second substrate having a front and rear surface,
- a developer material containing the carrier of the invention on said second substrate, said developer capable of reacting with said chromogenic material to form an image on the surface of said second substrate,
- wherein images are formed by image-wise exposing said coating to actinic radiation, and rupturing capsules in the image areas with said coating in facial contact with said developer sheet such that said internal phase is image-wise released from said ruptured capsules and there is image-wise transfer of said chromogenic material to said developer sheet and a patterned image-forming reaction occurs between said chromogenic material and said developer material. The capsule may be a microcapsule having a discrete capsule wall. The chromogenic material may be encapsulated with said radiation curable composition.

Moreover, the invention is directed to the transfer imaging system of U.S. Pat. No. 4,551,407 which further comprises the carrier of the present invention. Thus, the present invention relates to a transfer imaging system in which images are formed by image-wise reaction of one or more chromogenic materials and a developer, said system comprising:
- an imaging sheet comprising a first substrate,
- a chromogenic material,
- a photodepolymerizable composition which undergoes a decrease in viscosity upon exposure to actinic radiation,
- a coating on one surface of said first substrate comprising said chromogenic material and said photodepolymerizable composition optionally dispersed in the carrier of the invention,
- said photodepolymerizable composition being encapsulated in rupturable capsules as an internal phase, and
- a developer sheet comprising a second substrate having a front and rear surface,
- a developer material containing the carrier of the invention on said second substrate, said developer capable of reacting with said chromogenic material to form an image on the surface of said second substrate,
- wherein images are formed by image-wise exposing said coating to actinic radiation, and rupturing said capsules in the exposed areas with said coating in facial contact with said developer sheet such that said internal phase is image-wise released from said ruptured capsules and there is image-wise transfer of said chromogenic material to said developer sheet and a patterned image-forming reaction occurs between said chromogenic material and said developer material. The capsule may be a microcapsule having a discrete capsule wall. The chromogenic material may be encapsulated with said photodepolymerizable composition.

In addition, the present invention relates to the photosensitive imaging system and self-contained imaging sheet of U.S. Pat. No. 4,536,463, which further comprises the carrier of the present invention. Thus, the present invention relates to a photosensitive imaging system (or, self-contained sheet) in which images are formed by image-wise reaction of one or more chromogenic materials and a developer, said system (or sheet) comprising a substrate having front and back surfaces,
- a chromogenic material,
- a composition which undergoes a decrease in viscosity upon exposure to actinic radiation,
- a coating containing said chromogenic material and the carrier of the invention, and said composition on one of said front and back surfaces, and
- developer material capable of reacting with said chromogenic material to form a visible image,
- said composition being encapsulated in rupturable capsules as an internal phase,
- wherein images are formed by image-wise exposing said coating to actinic radiation and rupturing said capsules in the exposed areas and said chromogenic material and said developer react pattern-wise to form an image. The internal phase may be encapsulated in a microcapsule having a discrete capsule wall. The chromogenic material may be encapsulated with said photosensitive composition.

The invention is further directed to the imaging sheet of U.S. Pat. No. 4,822,714, which further comprises the carrier of the present invention. Accordingly, the present invention is directed to an imaging sheet useful in forming images by exposure-controlled, image-wise reaction of a chromogenic material and a developer, said sheet comprising:

a support having a front and rear surface, a layer of microcapsules and the carrier of the invention on said transfer coating, said microcapsules having discrete capsule walls which encapsulate an internal phase, said internal phase, including a photosensitive composition which undergoes a change in viscosity sufficient to control the release of the internal phase from said microcapsule, a chromogenic material associated with said microcapsule such that, upon image-wise exposing said layer of microcapsules to actinic radiation and subjecting said layer of microcapsules to a uniform rupturing force, said chromogenic material image-wise becomes available for reaction with a developer to form an image.

Furthermore, the invention is directed to the imaging system of U.S. Pat. No. 4,416,966 which further comprises the carrier of the present invention. Thus, the present invention is directed to an imaging system comprising:

an imaging sheet and a background dye or a combination of a dye precursor and a dye developer which react to form a background dye, said imaging sheet including:

a support having a front and rear surface, a plurality of capsules and the carrier of the invention in a layer on one surface of said support, and an internal phase contained within said capsules comprising a aecolorizing agent and a photnharenable or photosoftenable radiation sensitive composition, wherein images can be formed by image-wise exposing said sheet to actinic radiation and rupturing said capsules such that said decolorizing agent is image-wise released from said capsules and reacts with said associated background dye to decolorize it or inhibits, prevents or reverses the color forming reaction of said dye precursor and dye developer to produce a color difference in the form of an image.

The invention is further directed to the imaging material of U.S. Pat. No. 4,788,125 which further comprises the carrier of the present invention.

The term "microparticle" is used herein to define a particle formed from an admixture of an image-forming agent and a photosensitive Composition (Containing a depolymerizable polymer. The term "microparticle" is to be distinguished from the term "microcapsule" which is defined in U.S. Pat. Nos. 4,399,209 and 4,440,846 as a capsule having a discrete capsule wall or an encapsulated dispersion of a photosensitive composition in a binder.

Thus, the present invention is directed to an imaging material comprising a support having a front and rear surface, and a layer of photosensitive microparticles and carrier of the invention on one surface of said support, said microparticles including an image-forming agent and a photosensitive composition containing a polymer which is capable of undergoing cationically-initiated depolymerization and a photoinitiator including a silver halide and an organo silver salt, wherein, after exposing said microparticle to radiation, said microparticles, directly or with additional processing, release said image-forming agent or become permeable to a developer which reacts with said image-forming agent to form a visible image.

The microparticles may comprise a first set of microparticles containing a cyan image-forming material having a first wavelength sensitivity, a second set of microparticles containing a magenta image-forming material having a second wavelength sensitivity, and a third set of microparticles containing a yellow image-forming material having a third wavelength sensitivity, said first, second, and third sensitivities being sufficiently different that upon exposing said imaging material to a first radiation, substantially only said first microparticles release said image-forming material, upon exposing said imaging material to a second radiation different than said first radiation, substantially only said second set of microparticles release said image-forming material, and upon exposing said imaging material to a third radiation different than said first and second radiations, substantially only said third set of microparticles release said image-forming material.

The image-forming agent may be a colored dye or pigment.

The image-forming agent may be a chromogenic material and a developer material associated with said imaging material may be capable of reacting with said chromogenic material and forming a visible image.

The first, second, and third radiation may be respectivly red, green and blue light.

Also, the present invention is directed to the color imaging system of U.S. Pat. No. 4,842,976 which further comprises the carrier of the present invention. Thus, the present invention is directed to a color imaging system comprising:

an imaging sheet having a front and rear surface, and dry developer material disersed in the carrier of the invention and carried on said imaging sheet, or an imaging sheet, a separate image receiving developer sheet having a front and rear surface and a dry developer material dispersed in the carrier of the invention on said front surface, said imaging sheet having on the front surface thereof a coating comprising a cyan color precursor, a radiation curable photosensitive composition associated with said cyan color precursor, a magenta color precursor, a radiation curable photosensitive composition associated with said magenta color precursor, a yellow color precursor, and a radiation curable photosensitive composition associated with said yellow color precursor, said radiation curable photosensitive compositions having distinct sensitivities and being encapsulated in pressure rupturable capsules as an internal phase, said capsules having discrete capsule walls, said cyan, magenta and yellow color precursors being soluble in said associated photosensitive compositions or solvents for said color precursors being encapsulated with said associated photosensitive compositions and said color precursors being present in said capsules with said photosensitive compositions or in said discrete walls;

said imaging system being capable of forming images by image-wise exposing said imaging sheet to radiation actinic with respect to said photosensitive compositions, and rupturing at least said capsules containing photosensitive compositions unexposed by said actinic radiation in the presence of said developer material to form an image by reaction of said color precursors with said developer material.

The cyan, magenta and yellow color precursors may be encapsulated in pressure rupturable capsules with their associated radiation curable photosensitive compositions.

The invention is also applicable to "thermo-autochrome" technology of Fuji Photo Film Co., Ltd., such as direct thermal recording paper capable of full color imaging utilizing, for example, a diazonium salt compound as a color forming material. As a result of the present invention, the thermo-autochrome materials will be capable of being transferred to a receptor element, thereby opening new markets not previously contemplated. The thermo-autochrome technology is well known in the art.

In the preferred embodiment of the invention involving thermo-autochrome technology, a light-fixable thermal recording material is prepared by coating a heat responsive microcapsule containing a diazonium salt compound, a coupler, an a reaction-accelerating organic base, along with the carrier of the invention, optionally in one or more layers, on a substrate. Upon heating, the coupler and organic base diffuse into the microcapsule and a coupling reaction occurs to form an azo dye. Then, the entire print is irradiated with light, the wave length of which corresponds to the absorption of the diazonium salt compound. Unused diazonium salt compound is photo-decomposed and the image is fixed.

In another embodiment of the invention, a light-fixable thermal recording material is prepared by coating a heat-responsive microcapsule containing an oxidizable dye precursor in combination with a photo-radical generator, and a reducing agent (radical killer), plus carrier of the invention, on a substrate optionally in one or more layers. Upon heating, reducing agent diffuses into the microcapsule to form a latent image, The entire print is irradiated with light wherein the wavelength thereof corresponds to the absorption of the radical generator in each capsule, forming a radical. The radical is deactivated in a heated microcapsule by the reducing agent which diffused into the capsule, and no color formation occurs. The oxidizable dye precursor is oxidized by the radical (dehydroaenation) in an unheated microcapsule and a color is obtained. Upon heating again, no color change occurs and the print is fixed.

In another embodiment, a light-fixable thermal recording material is prepared by coating a microcapsule containing an organic cationic-dye borate anion salt compound (e.g. colored compound) and an organic acid plus carrier of the invention optionally in one or more layers on a substrate. Upon heating, organic acid diffuses into the microcapsule and reacts with the borate anion to form a latent image. The entire print is irradiated with light wherein the wavelength thereof corresponds to the absorption of the dye salt. In an unheated capsule, the dye salt is activated and decolorizes (photobleaching). The borate anion is decomposed beforehand in a heated capsule and the photobleaching does not occur. Thus, photobleaching takes place in the unheated portion. Because photobleaching is irreversible, no color change occurs by successive heating or irradiation with light, and the print is fixed.

In a further embodiment of the invention, a recording material is prepared by coating a heat responsive microcapsule containing a basic leuco dye (color former), a liquid vinyl monomer and a photo radical generator, with a phenolic color developer and the carrier of the invention, optionally in one or more layers, on a substrate. Upon heating, the color developer diffused into the microcapsule and reacts with the color former to form a dye. Then, the entire print is irradiated with light wherein the wavelength corresponds to the absorption of the photo-radical generator, and the vinyl monomer in the microcapsule polymerized and solidified.

In a still further embodiment of the invention, a recording material is prepared by coating a heat responsive microcapsule containing a basic leuco dye and a phenolic color developer having a polymerizable vinyl group, along with the carrier of the invention, optionally in multiple layers, on a substrate.

Of the above-mentioned methods, the diazonium salt compound method is preferred. Usami et al., "The Development of Direct Thermal Full Color Recording Material", *J. Inf. Recording*, 1996, Vol. 22, pp. 347–357. To obtain a full color print, the imaging material comprises a base support (e.g paper), a cyan color forming layer, a magenta color forming layer, a yellow color forming layer and an optional protective coating of the invention. The carrier of the invention is incorporated into one or more of these color forming layers. The innermost color forming layer is composed of a basic leuco dye and a phenolic compound developer, which reacts to form a cyan dye, plus carrier of the invention. The basic leuco dye is encapsulated in a heat responsive microcapsule. The magenta-color forming layer is composed of an encapsulated diazonium salt compound which decomposes when exposed to 365 nm ultraviolet light, an organic base, and a coupler, reacting to form a magenta azo dye. The yellow-color forming layer is composed of an encapsulated diazonium salt compound which decomposes when exposed to 420 nm ultraviolet light, an organic base, and a coupler, reacting to form a yellow azo dye.

The heat-responsive microcapsule in the yellow-color forming layer has a high thermo sensitivity and therefore responds to low thermal energy. The heat-responsive microcapsule in the magenta-color forming layer has a mid-range thermo sensitivity, and the heat-reponsive microcapgule in the cyan color forming layer has a low thermo sensitivity.

A full color print can be obtained in a five-step process. First, the yellow-color forming layer reacts to low levels of thermal energy to generate the yellow portion of the image. Second, the entire print is exposed with a 420 nm ultraviolet lamp which decomposes the diazonium salt compound remaining in the yellow-color forming layer. This exposure fixes the yellow-color forming layer. Third, the magenta-color forming layer reacts to mid-range levels of thermal energy to generate the magenta portion of the image. Fourth, the entire print is exposed with a 365 nm ultraviolet lamp, S which decomposes the diazonium salt compound remaining in the magenta-color forming layer. Finally, the cyan-color forming layer reacts to high levels of thermal energy to generate the cyan portion of the image.

The diazonium salt compound in the yellow color forming layer has two photosensitivity peaks, at 355 nm and 420 nm. The diazonium salt compound in the magenta color forming layer has a photosensitivity peak at 365 nm. So, exposure with 420 nm ultraviolet light can selectively decompose the diazonium salt compound in the yellow color forming layer. A subsequent exposure to 365 nm ultraviolet can decompose the diazonium salt compound in the magenta color forming layer.

A diazonium salt compound gives both thermo sensitive and light fixable properties to the yellow and magenta-color forming layers. The diazonium salt compound is dissolved in core oil and encapsulated in a microcapsule. The diazonium salt compound is thus completely isolated from the coupler and the organic base, making it stable over a long period of the time.

The coupler is used preferably in an amount of from. 0.1 to 30 parts by weight per part by weight of the diazo compound. The organic base is used preferably in an amount of from 0.1 to 30 parts by weight per part by weight of the diazo compound.

The microcapsule's wall is preferably poly(urea/urethane). It is known that the poly(urea/urethane) wall membrane of a microcapsule becomes permeable above its glass transition temperature (Tg). When the color forming layer is heated above the Tg of the capsule's wall, a. coupler and an organic base instantly permeate the wall and react with the diazonium salt CompoUnd in a core oil to form dye.

All color forming materials must be water insoluble and oil soluble. The diazonium salt compounds and the basic leuco dye are dissolved in core oils and encapsulated. If the water solubility of these materials is too high, excessive amounts of the materials will escape to the outside of the capsule's wall. Leaking color forming material causes color forming reactions and increases background density. The couplers and the phenolic compound developers are also dissolved in a hydrophobic solvent and emulsified in the carrier of the invention or in said carrier of the invention/gelatin mixture. Water soluble couplers and phenolic compound developers tend to diffuse into the other color forming layers and cause undesirable color forming reactions during imaging.

To make diazonium salt compounds water insoluble, a counter ion of the diazonium must be selected from hydrophobic groups such as $C_8H_{17}SO_3^-$, $PF_6^-$, $BF_4^-$ or B (phenyl) $_4^-$, and hydrophobic substituents must be introduced to the structure.

The maximum wave length of a diazonium salt compound is controlled by introducing a substituent group in an aromatic ring of a benzenediazonium structure. It is known that the introduction of an electron-donating substituent group increases the maximum absorption wave length.

The color hues of the azo dyes, which are formed in the yellow and magenta-color forming layers, depends on both the diazonium salt compounds and the couplers. The color hue Qf the basic dye; however, is almost completely dependent on the basic leuco dye.

Additionally, if a silver salt is present in the imaging material then the silver salt is preferably a non-organic silver salt. Further, a dye donating substance is preferably not present in the imaging material.

The image quality is evaluated with the FUJIX POTOJOY PRINTER NC-1.

In the thermal processing transfer systems of the present invention, the melting point of the carrier material may be selected as desired. For instance, if it is desired that the carrier should not melt during the imaging of the thermal sensitive microcapguleg, then the material chosen for the carrier should have a melting point which will survive the imaging of the material. Then, the carrier will only melt during transfer of the image.

Heat sensitive recording materials are known in the art. Thus, the invention is applicable to such materials and include, for instance, materials disclosed in U.S. Pat. Nos. 5,494,772, 5,492,789, 5,304,452, 5,661,101, 5,593,938, 5,543,260, 5,525,571, 5,514,636, 5,486,446, 5,410,335, 5,409,880, 5,409,797, 5,407,777, 5,338,642, 5,328,796, 4,857,941, 4,760,048, 4,464,376, and references cited therein.

The Thermo-Autochrome microcapsules according to the present invention can be prepared as detailed in U.S. Pat. No. 5,492,789, however, these procedures are merely illustrating and are not to be considered as limiting.

In an embodiment of the present invention wherein Thermo-Autochrome technology is employed the recording material may be prepared by coating a support, such as paper, with at least one coating comprising the carrier of the present invention, Thermo-Autochrome (e.g. light-fixable heat-sensitive) microcapsules, a coupler and an organic base. The coating procedure according to the present invention may be accomplished by bar coating, blade coating, air knife coating, gravure coating, roll coating, spray coating, dip coating, curtain coating and the like. Following each coating procedure, each layer is dried.

Recording on the (e.g. light-fixable) heat-sensitive recording material of the present invention may be carried out as follows. The recording material is imagewise heated with a thermal head, etc. to soften the capsule wall whereby the coupler and the organic base outside the capsules enter the inside of the capsules to develop a color. After the color development, the recording layer is exposed to light having the absorption wavelength of the diazonium salt whereby the diazonium salt decomposes and loses its reactivity with the coupler. As a result, the image is fixed.

Light sources for image fixation include various fluorescent lamps, xenon lamps, and mercury lamps. It is desirable for efficient fixation that the emission spectrum of the light source substantially meets the absorption spectrum of the diazo compound used.

A representative imaging sheet of the invention may be formed as follows. A support is coated with a layer containing the carrier of the present invention, Thermo-Autochrome microcapsules, a coupler and an organic base. This layer is then dried. A representative formulation of Thermo-Autochrome microcapsules, lacking only in the carrier of the present invention, is described in any one of Examples 3, 22, and 26 of U.S. Pat. No. 5,661,101, and Examples 5 and 10 of U.S. Pat. No. 5,543,260.

Another embodiment concerning Thermo-Autochrome technology and the present invention relates to an imaging system, which comprises:

a support having a front and rear surface;
at least one thermal recording layer comprising the carrier of the present invention and (e.g. light-fixable) thermal sensitive microcapsules coated on said front surface of the support,
wherein said thermal recording layer is capable of transferring and adhering an image formed by said microcapsules from said front surface of said support upon the application of heat energy to the rear surface of the support, said thermal recording layer strips from said front surface of the support by liquefying and releasing from said support when heated, said liquefied thermal recording layer providing adherence to a receptor element by flowing onto said receptor element and solidifying thereon, said adherence does not require an external adhesive layer, with the proviso that the carrier material is not capable of reacting to form an image, and
wherein said thermal sensitive microcapsules are capable of separating an inner phase within said microcapsules from an outer phase contained outside said microcapsules, wherein said inner phase is capable of reacting with said outer phase to create a color forming element.

In the Thermo-Autochrome imaging system explained above, the heat-responsive microcapsules have discrete capsular walls capable of isolating said inner phase from said outer phase, wherein said inner phase, for instance, comprises a diazonium salt compound and said outer phase comprises a coupler and a reaction-accelerating organic base. This outer phase also comprises the carrier of the present invention.

In another embodiment concerning Thermo-Autochrome technology and the present invention, the imaging system explained above comprises an imaging sheet useful in forming images by temperature controlled exposure of a said inner phase with said outer phase, said sheet comprising:

a support having a front and rear surface;

a thermal transfer layer coated on said front surface of said support, comprising. the carrier of the present invention and (e.g. light-fixable) thermal sensitive microcapsules, said microcapsules having discrete capsule walls which encapsulate said internal phase, said internal phase, including, for instance, a diazonium salt compound, said outer phase comprising, for instance, a coupler which upon an increase in temperature of said capsular wall diffuses into said microcapsule and reacts with said inner phase to form a color forming element.

According to the Thermo-Autochrome imaging system of the present invention said (e.g. light-fixable) thermal recording layer preferably comprises three separate layers, wherein each layer is capable of generating a color selected from the group consisting of yellow, cyan and magenta, with the proviso that each layer must generate a different color. Said colors are generated in response to heat. Specifically, said yellow color is generated in response to a thermal energy level which is lower than the thermal energy level sufficient to generate said cyan color. Additionally, said magenta color is generates in response to a thermal energy level which is lower than the thermal energy level sufficient to generate said cyan color and which is higher than the thermal energy level sufficient to generate said yellow color.

The yellow and cyan colors are fixed by exposure to ultraviolet radiation. Specifically, the yellow color is fixed in response to radiation having a 420 nm wavelength and the cyan color is fixed in response to radiation having a 365 nm wavelength.

In another embodiment concerning,Thermo-Autochrome technology and the present invention, the imaging system also relates to an imaging sheet useful in forming images onto a receptor surface, said sheet comprising:

a support having a front and rear surface;

a transfer layer coated on said front surface of said support, comprising the carrier of the present invention and (e.g. light-fixable) thermal sensitive microcapsules, said microcapsules having discrete capsule walls which encapsulate said internal phase, said internal phase, including a diazonium salt compound, said outer phase comprising a coupler which upon an increase in temperature of said capsular wall diffuses into said microcapsule and reacts with said inner phase to form a dye.

One preferred application of this invention with respect to Thermo-Autochrome technology is directed to transfer elements capable of producing multicolor dye images. Such a transfer element comprises a support and a plurality of color forming layers coated thereon. The color forming layers include at least one blue recording yellow dye image forming layer, at least one green recording magenta dye image forming layer, and at least one red recording cyan dye image forming layer. Interlayers may be positioned between the color forming layers. Each image forming layer includes at least one microcapsule layer.

Accordingly, another embodiment concerning Thermo-Autochrome technology and the present invention is directed to an imaging system, which comprises a support having a front and rear surface;

a transfer layer comprising the carrier of the present invention and the (e.g. light-fixable) thermal sensitive microcapsules; and an optional layer of clear thermoplastic material.

The transfer layer of the present invention is applicable to any imaging system based on thermal sensitive microencapsulates. Said system comprises a support;

at least one transfer layer coated on top of gaid support, comprising the carrier of the invention and (e.g. light-fixable) thermal sensitive microcapsules, said carrier preferably having a melting point of approximately 100° C. to 180° C., and which is capable of transferring and adhering an image from said front surface of said support upon the application of heat energy to the rear surface of the support, said carrier strips from said front surface of the support by liquefying and releasing from said support when heated (and taking the formed image and non-image area wish it), said liquefied carrier providing adherence to a receptor element by flowing onto said receptor element and solidifying thereon, said adherence does not require an external (e.g. surface) adhesive layer, and an optional layer of clear thermoplastic material, wherein the adherence of the transfer layer to the receptor element preferably occurs in an area at least coextensive with the area of said microcapsules, with the proviso that the carrier is not capable of reacting (e.g. with a color precursor) to form an image.

Another embodiment of the present invention relating to Thermo-Autochrome technology is directed to an imaging sheet useful in forming images onto a receptor surface, said sheet comprising:

a support having a front and rear surface;

a transfer layer on said front. surface of said support, comprising the carrier of the present invention and (e.g. light-fixable) thermal sensitive microcapsules.

The present invention further relates of a method of transferring an image to a receptor element, which comprises the steps of:

(a) forming the direct thermal recording image described above, said image being formed on a front surface of a support having a front and a back surface;

(b) positioning the front surface of said image against said receptor element;

(c) applying heat to the rear surface of the support to transfer the image to the receptor element.

The various layers of the imaging material are formed by known coating techniques, such as by roll, blade, curtain coating and air-knife coating procedures The resulting material, then is dried by means of, for example, steam-heated drums, air impingement, radiant heating, or some combination thereof. Some care must be exercised, however, to assure that drying temperatures are sufficiently low so that the particles of thermoplastic polymer present in the transfer layer do not melt during the drying process.

The invention is illustrated in more detail by the following non-limiting examples:

EXAMPLE 1

Coating Solutions Formulation A:

62.8% Photosensitive Microcapsule at 31.2% solids 18.8% HRJ4098 phenolic developer resin (Schnectady Chemical Co.) at 53.7% solids 3.0% Varion CAS surfactant at 10% solution 15.4% $H_2O$ to make 30% total solids The carrier plus Formulation A is blended together as follows:

| Michem 58035 | 5 parts | | |
|---|---|---|---|
| Michem 4983R | 1 part | Michelman Inc. | 40–50% |
| Formulation A | | | 50–30% |
| Microthene FE532 or FN500 | | Quantum Ind. | 10–20% |

(Bead size 1–20 microns with a reported melting temperature of 80 to 180° C.)

The preparation of the photosensitive microcapsules is described in U.S. application Ser. No.: 755,400 filed Jul. 16, 1985 (U.S. Pat. No. 4,904,645).

The coating solution and carrier is then coated onto a polyester support with a #12 coating rod and air gun dried.

The coated sheet is then image-wise exposed through a mask for 5.2 seconds using a fluorescent light source.

The exposed sheet is processed at high pressure with a calendaring roll as described in Example 1 of U.S. Pat. No. 4,751,165.

EXAMPLE 2

Referring to FIG. 2, the method of applying the image and non-image areas to a receptor element will be described.

The imaging sheet 50 is prepared, exposed and developed to form an image as in Example 1. A receptor element (e.g., tee shirt 62) is laid flat as illustrated, on an appropriate support surface, and the front surface of the imaging sheet 50 is positioned on the tee shirt. An iron 64 is run and pressed across the back 52A of the imaging sheet. The image and non-image areas are transferred to the tee-shirt and the support is removed and discarded.

EXAMPLE 3

Considering % solids and color balance requirements, photosensitive microcapsules with initiators responding to 350 nm, 390 nm, and 470 nm are blended together.

Coating Formulation B:

59.4% capsule blend @ 33a solids 18.8% HRJ4098 phenolic developer resin @ 53.7 solids 3.0% Varion CAS @ 10% solution 18.8% $H_2O$ to make 30% solids coating solution The carrier plus Formulation B is blended together as follows:

| Michem 58035 | 5 parts | | |
|---|---|---|---|
| Michem 4983R | 1 part | Michelman Inc. | 40–50% |
| Formulation B | | | 50–30% |
| Microthene FE532 or FN500 | | Quantum Ind. | 10–20% |

(Bead size 1–20 microns with a reported melting temperature of 80 to 180° C.)

For preparation of the microcapsules, reference can be made to U.S. application Ser. No. 755,400 filed Jul. 16, 1985.

The coating solution is coated onto a polyester support using a #12 coating rod and air gun to dry. The coated sheet is then image-wise exposed through color separation masks for 24,6 and 3 seconds at 350 nm, 390 nm, and 470 nm, respectively. A 1000 watt Xenon arc lamp is used with filters to modulate the wavelength.

The exposed sheet is processed at high pressure through a calendar roller as described in Example 2 of U.S. Pat. No. 4,751,165.

EXAMPLE 4

A paper support which is not coated on both sides with polyethylene is coated with a melt-transfer layer consisting of a mixture of Michem® 58035R and Michem® Prime 4983R. Both materials are available from Michelman,.Inc., Cincinnati, Ohio. A ratio of four or five to one of 58035R to 4983R is used. The basis weight of the melt-transfer layer is 8 g/m². Michem® 58035R is a 35 percent solids dispersion of Allied Chemical's AC 580, which is apprgximately 10 percent acrylic acid and 90 percent ethylene. The polymer reportedly has a softening point of 102° C. and a Brookfield viscosity of 0.65 Pas (650 centipoise) at 140° C. Michem® Prime 4983R is a 25 percent solids dispersion of Primacor® 985 made by Dow Chemical Company. The polymer contains 20 percent acrylic acid and 80 percent ethylene. The copolymer has a Vicat softening point of 43° C. and a ring and ball softening point of 108° C. The melt flow rate of the copolymer is 500 g/10 minutes.

The melt-transfer layer then is coated with a carrier comprising particles of a thermoplastic polymer, a binder, and a cationic polymer, said carrier containing microcapsules as formed as in Example 1. When the thermoplastic binder and/or the binder are the variables, the cationic polymer in every case is an amide-epichlorohydrin copolymer, namely, either Kymene® 557H or Reten® 204LS, both being supplied by Hercules Inc., Wilmington, Del. The cationic polymer is included at a level of 5 weight percent, based on the weight of the thermoplastic polymer. The carrier is dried by heating at 80°–95° C. The basis weight of the carrier layer is 15 g/m².

In general, a minimum amount of binder is used. For example, 10 weight percent of a polyacrylate, Rhoplex® B-15J (Rohm and Haas Company) may be used. Excess binder is expected to reduce the porosity of the carrier layer and make it less absorbent. Another binder which may be used at the 10 weight percent level is Michem® 58035, described above. The binder must be compatible with the cationic polymer. Two binders which are more compatible with the cationic polymer and which yellow less than the Michem® 58035 are Airflex® 124 and Airflex® 125, both poly(vinyl alcohol) stabilized ethylene-vinyl acetate copolymers. The materials are available from Air Products and Chemicals, Inc., Allentown, Pa.

Several thermoplastic polymers may be used including Microthene® FE 532, an ethylene-vinyl acetate copolymer supplied by Millenium Chemical Incorp., Cincinnati, Ohio. The particle size is reported to average approximately 20 micrometers. The Vicat softening point is 75° C. The melt flow rate of the copolymer is 9 g/10 minutes and it is reported to have a density of 0.928 g/cm³. Another thermoplastic polymer is Microthene® FN 500, a low density polyethylene powder also supplied by USI Chemicals Co. The material has an average particle size of 20 micrometers, a Vicat softening point of 83° C., a melt flow rate of 22 g/10 minutes, and a density of 0.915 g/cm³.

The material is exposed, developed and transferred as in Example 2.

EXAMPLE 5

Example 1 is repeated, but using the following thermoplastic polymers:

Thermoplastic Polymer A

This polymer is Microthene® FE 532, described in Example 4.

Thermoplastic Polymer B

This material is Microthene® FN-500, also described in Example 4.

Thermoplastic Polymer C

Thermoplastic Polymer C is Corvel® 2093. It is a polyester. The average particle size is 20 micrometers, the melting point of the polymer is approximately 80° C., and the melt flow rate is reported to be "high". The material is supplied by Powder Coatings Group of the Morton Chemical Division, Morton Thiokol, Inc., Reading, Pa.

Thermoplastic Polymer D

This polymer is MP 22.

Thermoplastic Polymer E

Thermoplastic Polymer E is MPP 611.

Thermoplastic Polymer F

This material is MPP 635, also a polyethylene supplied by Micro Powders, Inc. The average particle size of the polymer is 5 micrometers, the melting point is reported to be 124° C., and the melt flow rate is "high".

Thermoplastic Polymer G

This polymer is Accumist® B6, supplied by Allied Chemical Company, Morristown, N.J. The polymer is a polyethylene having a melting point of 126° C. The average particle size of the polymer is 6 micrometers and the melt flow rate is "high".

Thermoplastic Polymer H

Thermoplastic Polymer H is Accumist® B12, also supplied by Allied Chemical Company. The polymer is a high density polyethylene having a melting point of 126° C. The average particle size of the polymer is 12 micrometers.

Thermoplastic Polymer I

This polymer is DPP 714, a polystyrene dispersion supplied by Dow Chemical Company, Midland, Mich.

Thermoplastic Polymer J

This material is Piccotex® LC55R, a styrene-methyl styrene copolymer dispersion supplied by Hercules, Inc.

Thermoplastic K

Thermoplastic Polymer K is DL 256, a polystyrene dispersion also supplied by Dow Chemical Company.

Thermoplastic L

This polymer is BN 4901X, a polystyrene dispersion available from BASF Corporation, Sarnia, Ontario, Canada.

Thermoplastic M

This material is Ropaque®, a polystyrene dispersion supplied by Rohm and Haas Company, Philadelphia, Pa.

Four different binders are used:

Binder A

Binder A is Carboset® 514H, a polyacrylate binder dispersed in water, supplied by B.F. Goodrigh Company, Cleveland, Ohio.

Binder B

This binder is Rhoplex® B15, described in Example 15.

Binder C

Binder C is Michem® 58035, also described in Example 15.

Binder D

This binder is Marklube® 542, a cationic low density polyethylene emulsion from Ivax Industries, Inc., Rock Hill, S.C.

The composition of the carrier layer is summarized in Table 1 below. In the Table, the "TP" column identifies the thermoplastic polymer by letter, the "Type" column identifies the binder by letter, and basis weights are given in $g/m^2$.

TABLE 1

Summary of Carrier Composition with Various Thermoplastic Polymers

| TP | Binder Type | Wt. % | Basis Weight |
|---|---|---|---|
| A | A | 10 | 21 |
| A | B | 10 | 23 |
| A | C | 10 | 23 |
| A | C | 20 | 23 |
| B | C | 50 | 31 |
| B | C | 10 | 23 |
| C | C | 10 | 32 |
| D | C | 10 | 30 |
| E | C | 10 | 23 |
| E | C | 12.5 | 28 |
| E | C | 12.5 | 8 |
| E | C | 12.5 | 13 |
| F | C | 10 | 23 |
| F | C | 12.5 | 13 |
| F | C | 18 | 11 |
| F | C | 20 | 13 |
| F | D | 25 | 13 |
| G | C | 18 | 13 |
| H | C | 18 | 13 |
| I | C | 10 | 17 |
| J | C | 10 | 17 |
| K | C | 10 | 8 |
| L | C | 10 | 8 |
| M | C | 10 | 8 |
| M | C | 30 | 8 |
| M | C | 40 | 8 |

EXAMPLE 6

Example 5 is repeated without the melt-transfer layer.

EXAMPLE 7

A base sheet of fiber based paper which is not coated with polyethylene on both sides is coated with a low molecular weight polymer film layer, referred to hereinafter as the first layer. The next layer was a film bdaed Qn a polymer having a higher molecular weight, referred to hereinafter as the second layer. Finally, the carrier (on top of the second layer) consisted mainly of low molecular weight polyethylene wax particles, plus microcapsules as described in Example 1.

A number of multi layered samples (including the base sheet) are evaluated. In every case, the carrier layer consisted of 77 weight percent MPP 635 (Thermoplastic Polymer F), 8 weight percent of BN 4901X (Thermoplastic Polymer L), 10 weight percent Michem® 58035 (Binder C), 4 weight percent Reten® 204LS (cationic polymer), and 1 weight percent Triton® X-100, a surfactant, all based on the total weight of the layer. These weights of binder, cationic polymer, and surfactant are equivalent to 12, 5 and 1 weight percent, respectively, based on the weight of thermoplastic polymer.

A preferred sample using this format contains the following:

First layer: The layer consisted of 45 weight percent Michem® 4983 and 55 weight percent Chemawax® 40. The layer is applied as a mixed latex. The basis weight of the layer was 8 g/m².

Second layer: The layer, located adjacent to the paper, consisted of Epolene® C13 which is formed by melt extrusion at a basis weight of 20 g/m². The polymer is a 200 melt flow rate low density polyethylene obtained from Eastman Chemical Products, Inc., Kingsport, Tenn.

Another material which may be used as the second layer and which can be extrusion coated on the paper base sheet is Nucrel® RX 62, supplied by E. I. Du Pont de Nemours and Company, Inc., Wilmington, Del. The polymer is an ethylene-methacrylic acid copolymer having 10 weight percent methacrylic acid and a melt flow rate of around 500 g/10 min.

The material is exposed, developed and transferred as in Example 2.

EXAMPLE 8

This Example evaluates various cationic polymers. Two types of carrier layers are employed, in which the cationic polymer is included as a component. Type A consists of Microthene® FE 532 (Thermoplastic Polymer A), 13 weight percent of Michem® 58035 binder (Binder C), based on the weight of the thermoplastic polymer, 1 weight percent Triton® X-100 surfactant, and the cationic polymer. The basis weight of the layer is 15 g/m². The Type B layer consists of MPP 635 (Thermoplastic Polymer F), 18 weight percent of Michem® 58035 binder (Binder C), based on the weight of the thermoplastic polymer, 1 weight percent Triton® X-100 surfactant, and the cationic polymer. The basis weight of the layer was 13 q/m². When The Type B second layer is employed, a third layer consisting of Michem® 58035 at a basis weight of 17 g/m² is employed, adjacent to the paper support. The various cationic pglymers evaluated are as follows:

Cationic Polymer A

Cationic Polymer A is Kymene® 557, an amide-epichlorohydrin copolymer available from Hercules, Inc.

Cationic Polymer B

This polymer is Calgan® 261LV, a quaternary polymer. It is available from Calgon Corporation.

Cationic Polymer C

This material is Corcat® P145. It is a polyethyleneimine supplied by Cordova Chemical Company.

Cationic Polymer D

Cationic Polymer D is Parez® 631NC, a polyacrylamide available from American Cyanamide.

Cationic Polymer E

This material is Betz® 1260. It is obtained from Betz Paperchem, Trevose, Pa.

Cationic Polymer F

This polymer is Reten® 204LS, an amide-epichlorohydrin copolymer available from Hercules, Inc.

Cationic Polymer G

Verona® C-300 from Miles Inc., Pittsburgh, Pa.

Cationic Polymer H

Aquaprox® UP103 from Synthron, Morgantown, N.C.

Cationic Polymer I

Tinofix® EW from Ciba-Geigy Corporation, Hawthorn, N.Y.

Cationic Polymer J

Reactofix® ES from Ivax Industries, Inc.

Cationic Polymer K

Protefix® TS, a cationic carbamide from Synthron.

In the table, the column "CP" Type" identifies the cationic polymer, whereas the column "Type" identifies the type of carrier employed, as described above.

TABLE 4

Evaluation of Various Cationic Polymers

| CP Type | Amount | Type |
| --- | --- | --- |
| A | 2 | A |
| A | 4 | A |
| A | 6 | A |
| B | 2 | A |
| B | 4 | A |
| C | 2 | A |
| C | 4 | A |
| D | 2 | A |
| D | 4 | A |
| E | 2 | A |
| F | 5 | A |
| F | 4 | A |
| F | 8 | A |
| G | 8 | B |
| H | 8 | B |
| I | 8 | B |
| J | 8 | B |
| K | 8 | B |

Microcapsules as described in Example 1 are incorporated into the carrier layer, which is coated on (i) a fiber base paper which is not coated on both sides with polyethylene and (ii) transparent polyacetate film. The material is exposed, developed and transferred as described in Example 2.

EXAMPLE 9

The formulations involving Cationic Polymer F as reported in Example 8 are modified further since yellowing may be encountered when images are heat transferred.

In the experiments, the paper base which is not coated on both sides with polyethylene is extrusion coated with 44 g/m² of Nucrel® RX62, an ethylene-methacrylic acid copolymer having a melt flow rate of 600 g/10 minutes supplied by E. I. Du Pont de Nemours and Co., Inc. The second layer had a basis weight of approximately 13 g/m².

The binder employed in the carrier, layer (e.g. containing microcapsules as described in Example 1) is either Airflex® 124 (Binder E) or Airflex 125® (Binder F). The, binder is present at a level of 26 weight percent, based on the weight of the thermoplastic polymer. The cationic polymer used is Retent® 204LS, the humectant is Polyglycol® E200, a poly(ethylene glycol) from Dow Chemical Company having a weight-average molecular weight of about 200; the humectant level is 10 weight percent, based on the weight of the thermoplastic polymer. The surifatant is Triton® X-100 at a level of 3 weight percent, based on the weight of thermoplastic polymer employed. The fluid viscosity modifier is Polyox® N80 at a level of 3 weight. percent, also based on the weight of the thermoplastic polymer. The thermoplastic polymers evaluated included micropowders MPP 635 and Accumist® A-12, from Micropowders and Allied Chemical Company, regpgctively. The material is exposed, developed and transferred as described in Example 2.

The experiments are summarized in Table 5. In the table, the "TP" column identifies the thermoplastic polymer by letter (see Example 5), the "WT.-% CP" column identifies the amount of Reten® 204LS employed in the second layer in weight percent, based on the weight of the thermoplastic polymer, and the "WT.-% Acid" column identifies the amount of citric acid included in the carrier, in weight-percent based on the weight of the thermoplastic polymer.

TABLE 5

Summary of Cationic Polymer F Formulation Modifications

| Sample | Binder | TP | Parts CP | Wt.-% Acid |
|---|---|---|---|---|
| 1 | F | H | 8 | None |
| 2 | F | H | 8 | 4 |
| 3 | E | H | 8 | None |
| 4 | F | F | 8 | None |
| 5 | F | F | 12 | None |
| 6 | F | F | 16 | None |

EXAMPLE 10

As described above, the present invention also relates to Thermo-Autochrome technology.

Coating Solution Formulation Y:

Coating solution formulation Y comprises the composition of light-fixable thermal recording microcapsules according to Example 2 of U.S. Pat. No. 4,771,032.

The carrier plus Formulation Y is blended together as follows:

| Michem 58035 | 5 parts | | |
|---|---|---|---|
| Michem 4983R | 1 part | Michelman Inc. | 40–50% |
| Formulation Y | | | 50–30% |
| Microthene FE532 or FN500 | | Quantum Inc. | 10–20% |

(Bead size 1–20 microns with a reported melting temperature of 80 to 180° C.)

The coating solution and carrier is then coated onto a polyester support with a #12 coating rod and air gun dried. The recording material is then subjected to the procedure described in the thermal recording Samples U.S. Pat. No. 5,486,446 as follows:

Applied power to thermal head and pulse duration are set so that the recording energy per area is 35 mJ/mm$^2$. The writing (I) of the heat-sensitive recording material is conducted using Thermal head (KST type, a product of Kyocera K.K.)

Subsequently, the recording material is exposed to an ultraviolet lamp (light emitting central wavelength: 420 nm; output 40W) for 10 seconds. Applied power to the thermal head and pulse duration are again set so that the recording energy per unit area is 62 mJ/mm$^2$, and writing (III) of the heat-sensitive recording material is conducted under these temperatures.

Furthermore, the recording material is exposed to an ultraviolet lamp (light emitting central wavelength: 365 nm; output: 40 W) for 15 seconds. Applied power to the thermal head and pulse duration are again set so that the recording energy per unit area is 86 mJ/mm$^2$, and writing (III) of the heat-sensitive recording material is conducted under these conditions.

Next, referring to FIG. 2, the method of applying the image to a receptor element will be described.

The imaging sheet 50 is prepared, exposed and developed to form an image as described above. A receptor element (e.g., tee shirt 62) is laid flat as illustrated, on an appropriate support surface, and the front surface of the imaging sheet 50 is positioned on the tee shirt. An iron 64 is run and pressed across the back 52A of the imaging sheet. The image and non-image areas are transferred to the tee-shirt and the support is removed and discarded.

EXAMPLES 11–15

Example 10 is repeated but this time the light-fixable thermal recording microcapsule formulation Y is substituted with other light-fixable thermal recording microcapsule formulations as follows:

| Example Number | Source of light-fixable thermal recording microcapsule formulation |
|---|---|
| 11 | Ex. 5 of U.S. Pat. No. 5,543,260 |
| 12 | Ex. 10 of U.S. Pat. No. 5,543,260 |
| 13 | Ex. 3 of U.S. Pat. No. 5,661,101 |
| 14 | Ex. 22 of U.S. Pat. No. 5,661,101 |
| 15 | Ex. 26 of U.S. Pat. No. 5,661,101 |

All cited patents, copending applications, provisional applications, and publications, referred to in this application are herein incorporated by reference.

The invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A developer or receiver sheet which comprises:
a support having a front and rear surface,
a developer material capable of reacting with a color forming substance and which is dispersed in a carrier which is capable of transferring and adhering developed image and non-image areas from said front surface of said support upon the application of heat energy to the rear surface of the support, said carrier strips from said front surface of the support by liquefying and releasing from said support when heated, said liquefied carrier providing adherence to a receptor element by flowing onto said receptor element and solidifying thereon, said adherence does not require an external adhesive layer, with the proviso that the carrier is not capable of reacting to form an image, wherein the carrier is cumulatively present in all layers on said support in an amount from about 15 g/m² to about 30 g/m², and wherein the carrier is capable of melting, flowing and transferring said image and non-image areas to the receptor at temperatures in the range of from more than 100° C. to about 180° C.

2. The developer or receiver sheet of system of claim 1, wherein the carrier comprises (i) particles of a thermoplastic polymer having dimeensions of about 1 to about 50 micrometers, from about 10 to about 50 weight percent of a film-forming binder, based on the weight of the thermoplastic polymer, and optionally from about 0.2 to about 10 weight percent of a fluid viscosity modifier, based on the weight of the thermoplastic polymer, (ii) about 15 to about 80 percent by weight of a film-forming binder selected from the group consisting of ethylene-acrylic acid copolymers, polyolefins, and waxes and from about 85 to about 20 percent by weight of a powdered thermoplastic polymer selected from the group consisting of polyolefins, polyesters, polyamides, waxes, epoxy polymers, ethylene-acrylic acid copolymers, and ethylene-vinyl acetate copolymers, wherein each of said film-forming binder and said powdered thermoplastic polymer melts in the range of from about 100° C. to about 180 degrees Celsius and particles of about 1 to about 50 micrometers, (iii) a film forming binder selected from the group consisting of ethylene-acrylic acid copolymers having particles of about 1 to about 50 micrometers, polyolefins, and waxes and which melts in the range of from about 100° C. to about 180 degrees Celsius, (iv) a thermoplastic polymer having particles of about 1 to about 50 micrometers selected from the group consisting of polyolefins, polyesters, and ethylene-vinyl acetate copolymers and which melts in the range of from about 100 to about 180 degrees Celsius or, (v) a thermoplastic polymer having particles of about 1 to about 50 micrometers selected from the group consisting of polyolefins, polyesters, and ethylene-vinyl acetate copolymers, ethylene-methacrylic acid copolymers, and ethylene-acrylic acid copolymers and which melts in the range of from about 100 to about 180 degrees Celsius.

3. The developer or receiver sheet of claim 1, wherein the carrier comprises particles of a thermoplastic polymer having dimensions of about 1 to about 50 micrometers, from about 10 to about 50 weight percent of a film-forming binder, based on the weight of the thermoplastic polymer, and from about 0.2 to about 10 weight percent of an viscosity modifier, based on the weight of the thermoplastic polymer.

4. The developer or receiver sheet of claim 1, wherein the carrier melts from about 100 to about 180 degrees Celsius and comprises particles of a thermoplastic polymer having dimensions of about 1 to about 50 micrometers, from about 10 to about 50 weight percent of a film-forming binder, based on the weight of the thermoplastic polymer, and from about 2 to about 20 weight percent of a cationic polymer, based on the weight of the thermoplastic polymer.

5. The developer or receiver sheet of claim 1, wherein the carrier comprises from about 15 to about 80 percent by weight of a film-forming binder selected from the group consisting of ethylene-acrylic acid copolymers, polyolefins, and waxes and from about 85 to about 20 percent by weight of a powdered thermoplastic polymer selected from the group consisting of polyolefins, polyesters, polyamides, waxes, epoxy polymers, ethylene-acrylic acid copolymers, and ethylene-vinyl acetate copolymers, wherein each of said film-forming binder and said powdered thermoplastic polymer melts in the range of from about 100 to about 180 degrees Celsius and said powdered thermoplastic compris- ing of particles which are from about 1 to about 50 micrometers in diameter.

6. The developer or receiver sheet of claim 1, wherein the carrier comprises a film forming binder selected from the group consisting of ethylene-acrylic acid copolymers, polyolefins, and waxes and which melts in the range of from about 100 to about 180 degrees Celsius.

7. The developer or receiver sheet of claim 1, wherein the carrier comprises a thermoplastic polymer selected from the group consisting of polyolefins, polyesters, and ethylene-vinyl acetate copolymers and which melts in the range of from about 100 to about 180 degrees Celsius.

8. The developer or receiver sheet of claim 1, wherein the carrier comprises a thermoplastic polymer selected from the group consisting of polyolefins, polyesters, and ethylene-vinyl acetate copolymers, ethylene-methacrylic acid copolymers, and ethylene-acrylic acid copolymers and which melts in the range of from about 100 to about 180 degrees Celsius.

9. A developer or receiver sheet which comprises:
a support having a front and rear surface,
a developer material capable of reacting with a color forming substance and which is dispersed in a carrier which is capable of transferring and adhering developed image and non-image areas from said front surface of said support upon the application of heat energy to the rear surface of the support, said carrier strips from said front surface of the support by liquefying and releasing from said support when heated, said liquefied carrier providing adherence to a receptor element by flowing onto said receptor element and solidifying thereon, said adherence does not require an external adhesive layer, with the proviso that the carrier is not capable of reacting to form an image, wherein the carrier is cumulatively present in all layers on said support in an amount from about 15 g/m² to about 30 g/m², and wherein the carrier is capable of melting, flowing and transferring said image and non-image areas to the receptor at temperatures in the range of from more than 100° C. to about 180° C., and wherein:
the carrier comprises particles of a thermoplastic polymer having dimensions of about 1 to about 50 micrometers, from about 10 to about 50 weight percent of a film-forming binder, based on the weight of the thermoplastic polymer, and from about 0.2 to about 10 weight percent of an viscosity modifier, based on the weight of the thermoplastic polymer; or
the carrier melts from about 100 to about 180 degrees Celsius and comprises particles of a thermoplastic polymer having dimensions of about 1 to about 50 micrometers, from about 10 to about 50 weight percent of a film-forming binder, based on the weight of the thermoplastic polymer, and from about 2 to about 20 weight percent of a cationic polymer, based on the weight of the thermoplastic polymer; or
the carrier comprises from about 15 to about 80 percent by weight of a film-forming binder selected from the group consisting of ethylene-acrylic acid copolymers, polyolefins, and waxes and from about 85 to about 20 percent by weight of a powdered thermoplastic polymer selected from the group consisting of polyolefins, polyesters, polyamides, waxes, epoxy polymers, ethylene-acrylic acid copolymers, and ethylene-vinyl acetate copolymers, wherein each of said film-forming binder and said powdered thermoplastic polymer melts in the range of from about 100 to about 180 decrees Celsius and said powdered thermoplastic comprises of particles which are from about 1 to about 50 micrometers in diameter.

10. The developer or receiver sheet of claim 1, wherein the carrier is cumulatively present in an amount from about 20 g/m² to about 30 g/m².

11. The developer or receiver sheet of claim 1, wherein the carrier is present in an amount of at least 50% by coating weight based on the total weight of the layers present on the support, excluding the support.

12. A developer or receiver sheet which comprises:

a support having a front and rear surface, a layer consisting essentially of a developer material capable of reacting with a color forming substance and which is dispersed in a carrier, said carrier is capable of transferring and adhering developed image and non-image areas from said front surface of said support upon the application of heat energy to the rear surface of the support, said carrier strips from said front surface of the support by liquefying and releasing from said support when heated, said liquefied carrier providing adherence to a receptor element by flowing onto said receptor element and soqlidifying thereon, said adherence does not require an external adhesive layer, with the proviso that the carrier is not capable of reacting to form an image, wherein the carrier is cumulatively present in all layers on said support in an amount from about 15 g/m² to about 30 g/m², and wherein the carrier is capable of melting, flowing and transferring said image and non-image areas to the receptor at temperatures in the range of from more than 100° C. to about 180° C.

13. A method of transferring image and non-image areas from the developer or receiver sheet of claim 1 to a receptor element, which comprises positioning the front surface of the sheet against a receptor element and applying heat to the rear surface of the sheet to transfer the image and non-image areas of the sheet to the receptor element.

* * * * *